(12) United States Patent
Huang et al.

(10) Patent No.: US 11,557,694 B2
(45) Date of Patent: *Jan. 17, 2023

(54) LIGHT EMITTING DEVICE

(71) Applicant: EPISTAR CORPORATION, Hsinchu (TW)

(72) Inventors: Chien Cheng Huang, Hsinchu (TW); Kuo-Wei Yen, Hsinchu (TW); Yu-Wei Kuo, Hsinchu (TW); Yao-Wei Yang, Hsinchu (TW); Pei-Hsiang Tseng, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 58 days.

This patent is subject to a terminal disclaimer.

(21) Appl. No.: 17/179,729

(22) Filed: Feb. 19, 2021

(65) Prior Publication Data

US 2021/0249561 A1    Aug. 12, 2021

Related U.S. Application Data

(60) Continuation of application No. 16/028,657, filed on Jul. 6, 2018, now Pat. No. 10,930,818, which is a
(Continued)

(51) Int. Cl.
*H01L 33/14* (2010.01)
*H01L 33/42* (2010.01)
*H01L 33/44* (2010.01)
*H01L 33/38* (2010.01)
*H01L 33/00* (2010.01)
(Continued)

(52) U.S. Cl.
CPC ........ *H01L 33/145* (2013.01); *H01L 33/0075* (2013.01); *H01L 33/24* (2013.01); *H01L 33/32* (2013.01); *H01L 33/38* (2013.01); *H01L 33/42* (2013.01); *H01L 33/44* (2013.01); *H01L 2933/0016* (2013.01); *H01L 2933/0025* (2013.01)

(58) Field of Classification Search
CPC ....... H01L 33/145; H01L 33/38; H01L 33/42; H01L 33/44; H01L 2933/0016; H01L 2933/0025; H01L 33/0075; H01L 33/24; H01L 33/32
See application file for complete search history.

(56) References Cited

U.S. PATENT DOCUMENTS 6,064,079 A    5/2000  Yamamoto et al.
8,969,901 B2   3/2015  Choi et al.
(Continued)

*Primary Examiner* — Bac H Au
(74) *Attorney, Agent, or Firm* — Patterson + Sheridan, LLP

(57) ABSTRACT

A light emitting device includes: a plurality of light emitting stacked layers, including a first surface and a second surface, wherein the second surface is electrically opposite to the first surface; a mesa structure; a current blocking layer disposed on the first surface, including a sidewall; and a transparent conductive layer disposed on the first surface; and a first pad electrode, disposed on the transparent conductive layer and on the first surface; wherein a retract distance of the transparent conductive layer with respect to an edge of the mesa structure is less than 3 μm; and wherein a retract distance of the transparent conductive layer with respect to an edge of the sidewall of the current blocking layer is less than 3 μm.

12 Claims, 8 Drawing Sheets

Related U.S. Application Data continuation of application No. 15/626,170, filed on Jun. 18, 2017, now Pat. No. 10,043,945, which is a division of application No. 14/985,165, filed on Dec. 30, 2015, now Pat. No. 9,705,035.

(51) Int. Cl.
*H01L 33/24* (2010.01)
*H01L 33/32* (2010.01)

(56) References Cited

U.S. PATENT DOCUMENTS

| | | |
|---|---|---|
| 9,312,450 B2 | 4/2016 | Choi et al. |
| 9,337,236 B2 | 5/2016 | Choi et al. |
| 9,537,055 B2 | 1/2017 | Park et al. |
| 9,705,035 B1 | 7/2017 | Huang et al. |
| 10,930,818 B2 * | 2/2021 | Huang .................. H01L 33/38 |
| 2012/0211788 A1 | 8/2012 | Yuh et al. |
| 2013/0234192 A1 | 9/2013 | Kim et al. |
| 2014/0183590 A1 | 7/2014 | Kim et al. |
| 2015/0349196 A1 | 12/2015 | Kim et al. |
| 2016/0218244 A1 | 7/2016 | Shin et al. |
| 2016/0315238 A1 | 10/2016 | Kuo et al. |

* cited by examiner

LIGHT EMITTING DEVICE

CROSS-REFERENCE TO RELATED APPLICATIONS

This application is a continuation application of U.S. patent application Ser. No. 16/028,657, filed on Jul. 6, 2018, which is a continuation application of U.S. patent application Ser. No. 15/626,170, filed on Jun. 18, 2017, which is a divisional application of U.S. patent application Ser. No. 14/985,165, filed on Dec. 30, 2015, now U.S. Pat. No. 9,705,035, and the content of which is hereby incorporated by reference in its entirety.

BACKGROUND OF THE APPLICATION

(a) Technical Field

The present application is related to a light emitting device and method of fabricating the same, and more particularly, to a light emitting device fabricated by chip on wafer processes with photolithography adopting a technique using a current blocking (CB) layer serving as a hard mask.

(b) Description of Background Art

The typical chip on wafer processes for fabricating a horizontal III-nitride based LED chip includes the following steps: first, the light emitting stacked layers (which typically includes p-type layers, n-type layers, and an active layer made from an inorganic semiconductor material sandwiched between one of the p-type layers and one of the n-type layers) are etched to form a mesa structure (requiring a first photolithography process). Second, a current blocking (CB) layer is formed on one of the upper LED stacked layer, and located underneath a p-side electrode, by wet etching (second photolithography process). Third, an ITO layer is formed to be covering the light emitting stacked layers, and exposing a reserved region for a p-side pad electrode of the p-side electrode and the mesa structure (third photolithography process). Fourth, p, n-side pad electrodes/finger electrodes are formed (fourth photolithography process). Fifth, a passivation layer is deposited over the entire top surface of the horizontal nitride LED chip except p, n-side pad electrodes (fifth photolithography process). Thus, conventional technique for fabricating the horizontal III-nitride based LED chip typically includes at least five separate photolithography processes, in which each time, the photolithography process requires the following individual sub-steps: cleaning and preparation of a photoresist-coated surface, applying and coating a photoresist layer onto a material layer such as by spin coating, performing exposure and developing after prebaking to form a patterned photoresist mask, performing wet or dry etching using the patterned photoresist mask, and removing the remaining patterned photoresist layer. In the above-described first step, the mesa structure etching process can be performed using inductively coupled plasma (ICP) etching to expose the n-type layer, such as a n-GaN layer (forming the n-mesa) upon etching a portion of the p-type layer, such as a p-GaN layer and the active layer (or can be also referred to as multiple quantum wells, MQW). Meanwhile, for the sake of preventing ITO layer pattern shift issues, for example leakage current issues between residue ITO and light emitting stacked layers sidewalls, the subsequent four photolithography processes are required to use the resulting mesa pattern obtained at the completion of the first photolithography process, as alignment reference. As a result, the conventional fabrication method for LED chip can be more time consuming (higher cycle time) and requires relatively high process costs.

SUMMARY OF THE APPLICATION

One purpose of the present application is to provide a light emitting device, such as an LED chip, or a laser diode (LD) that is fabricated by chip on wafer processes with photolithography adopting a technique using a current blocking (CB) layer serving as a hard mask.

Another purpose of the present application is to provide a method for fabricating a light emitting device, such as an LED chip, or a laser diode (LD), having more efficient and less costly chip on wafer photolithography processes.

To achieve at least one of the purposes, a light emitting device which includes a plurality of light emitting stacked layers, including a first surface and a second surface, wherein the second surface is electrically opposite to the first surface; a mesa structure; a current blocking layer disposed on the first surface, including a sidewall; and a transparent conductive layer disposed on the first surface; and a first pad electrode, disposed on the transparent conductive layer and on the first surface; wherein a retract distance of the transparent conductive layer with respect to an edge of the mesa structure is less than 3 μm; and wherein a retract distance of the transparent conductive layer with respect to an edge of the sidewall of the current blocking layer is less than 3 μm.

These and other objectives of the present application will no doubt become obvious to those of ordinary skill in the art after reading the following detailed description of the preferred embodiment that is illustrated in the various figures and drawings.

BRIEF DESCRIPTION OF THE DRAWINGS

The present application is illustrated by way of example and not limited by the figures of the accompanying drawings in which same references indicate similar elements. Many aspects of the disclosure can be better understood with reference to the following drawings. Moreover, in the drawings same reference numerals designate corresponding elements throughout. Wherever possible, the same reference numerals are used throughout the drawings to refer to the same or similar elements of an embodiment.

FIG. 2(*g*) shows a cross-sectional view of a passivation layer formed for the fabricated light emitting device of the option 1 for the method of fabricating the light emitting device according to the embodiment.

FIG. 2(*h*) shows a cross-sectional view of the current blocking layer being completely removed by wet-etching to form a pad opening for an option 2 (continuing from FIG. 2(*e*)) of the method of fabricating the light emitting device according to the embodiment.

FIG. 2(*i*) shows a cross-sectional view of a p-pad electrode and a n-pad electrode formed in the pad opening and on the mesa structure respectively for the option 2 for the method of fabricating the light emitting device according to the embodiment.

FIG. 2(*j*) shows a cross-sectional view of a passivation layer formed for the fabricated light emitting device of the option 2 for the method of fabricating the light emitting device according to the embodiment

DETAILED DESCRIPTION OF THE PREFERRED EMBODIMENTS

The present application will now be described more specifically with reference to the following embodiments. It is to be noted that the following descriptions of the embodiments of this application are presented herein for purpose of illustration and description only. It is not intended to be exhaustive or to be limited to the precise form disclosed.

Figure 1:
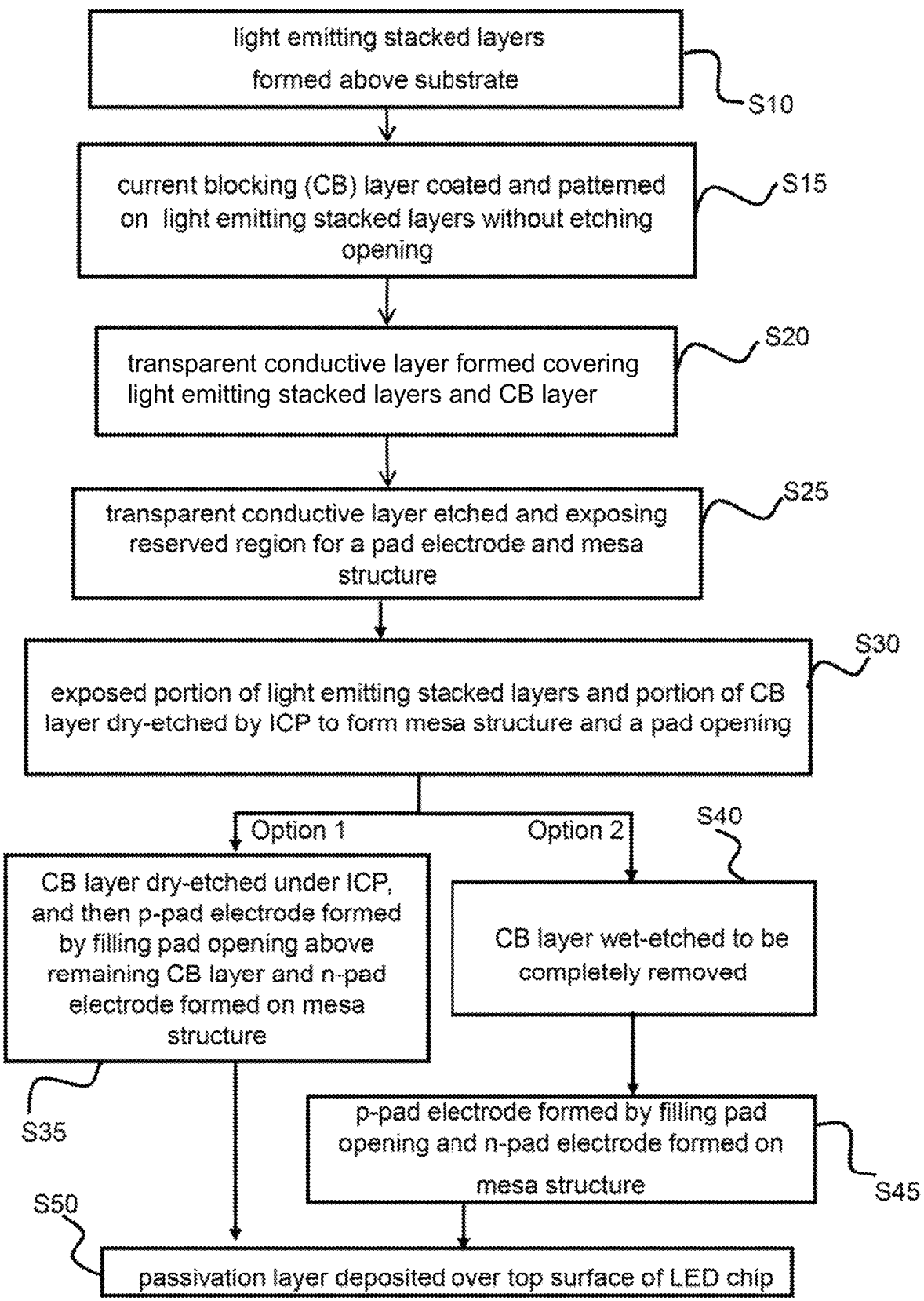
FIG. 1 shows a flow chart of a method for fabricating a light emitting device according to an embodiment of present application.
Figure 3:
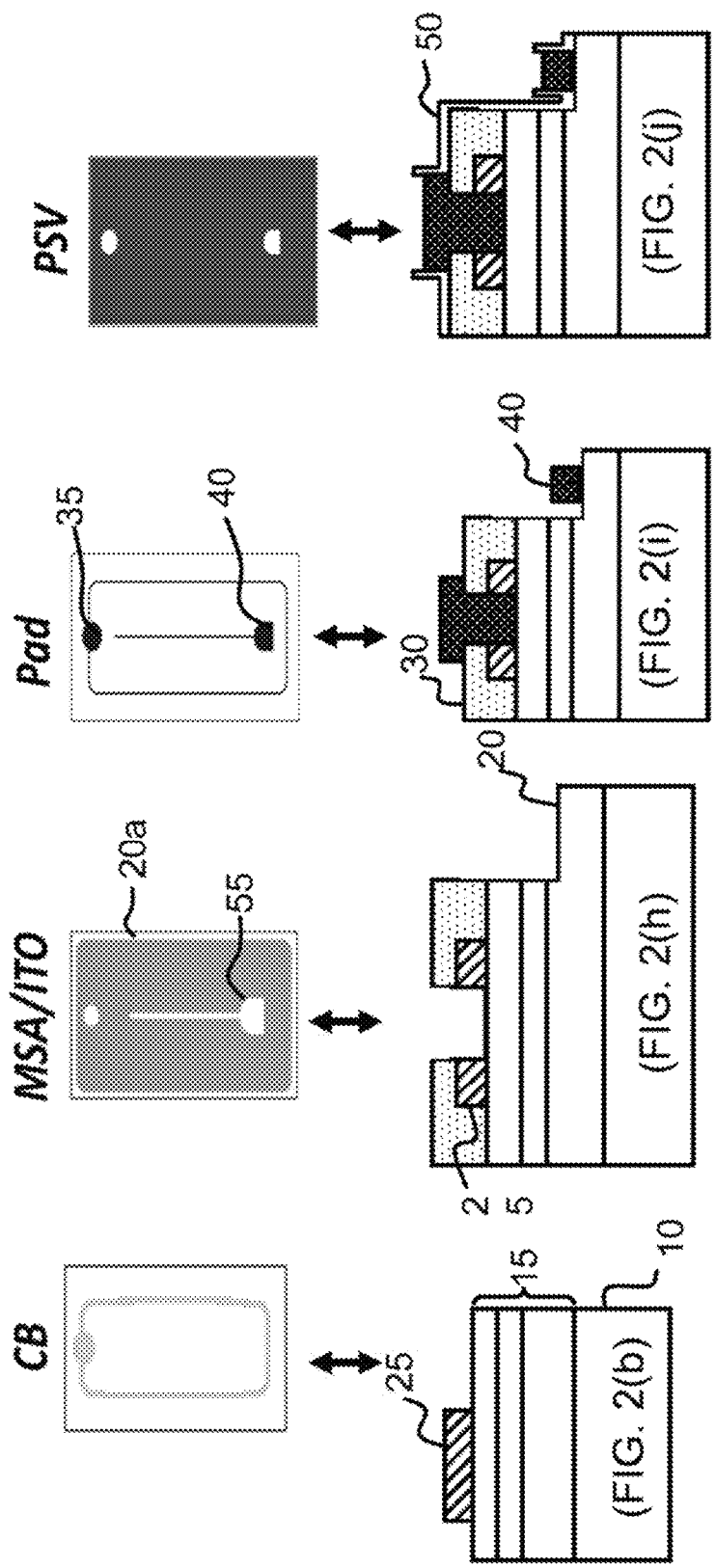
FIG. 3 shows top views of each layer in steps of FIGS. 2(*b*), 2(*h*)-2(*j*).
Figures 4A, 4B:
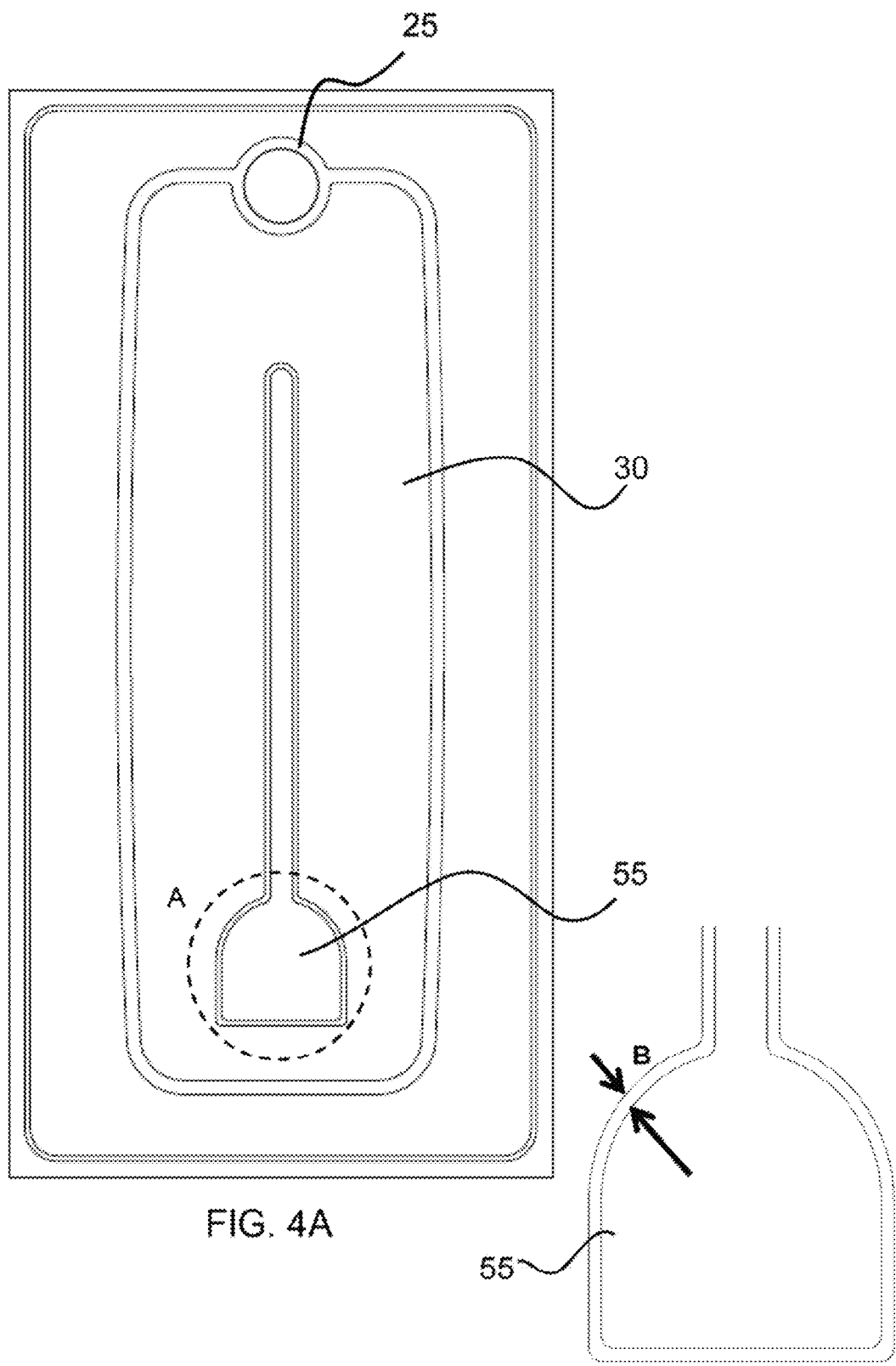
FIG. 4A shows a partial top view of the light emitting device with the CB layer exhibiting a ring-shape.
FIG. 4B shows an enlargement view of a portion of the light-emitting device of FIG. 4A.

A method for fabricating a light emitting device, such as an LED chip or an LD chip, according to an embodiment of present application is described as follow: FIG. 1 illustrates a flow chart of a method for fabricating a light emitting device according to an embodiment of present application, and FIGS. 2(*a*)-2(*j*) show a plurality of cross-sectional views of the corresponding chip on wafer fabrication processes for fabricating the light emitting device according to the embodiment, which includes the following steps: In Step S10, a plurality of light emitting stacked layers 15 (which may include p-type layers, n-type layers, and a planar active layer made from an inorganic semiconductor material sandwiched between one of the p-type layers and one of the n-type layers) are formed above a substrate 10, as shown in FIG. 2(*a*). The material of the light emitting stacked layers 15 includes aluminum gallium indium phosphide (AlGaInP), or aluminum gallium indium nitride (AlGaInN). The active layer includes single heterostructure (SH), double heterostructure (DH), double-side double heterostructure (DDH), or multi-quantum well (MQW) structure. Specifically, the active layer includes i-type, p-type, or n-type semiconductor. The active layer emits light when an electrical current passes through the light emitting stacked layers 15. When the active layer includes AlGaInP based material, the active layer emits amber series light, such as red light, orange light, or yellow light; when the active layer includes AlGaInN based material, the active layer emits blue, green, or UV light. The present embodiment illustrates the semiconductor light emitting stacked layer 15 with aluminum gallium indium nitride (AlGaInN) based material. These layers can be deposited by a variety methods, including MOVPE (metal organic vapor phase epitaxy), MBE (molecular beam epitaxy), or HVPE (hydride vapor phase epitaxy). The substrate 10 can be made of sapphire. In Step S15, a current blocking (CB) layer 25 is coated and patterned on the light emitting stacked layers 15, but without etching an opening for the CB layer 25, as shown in FIG. 2(*b*). The CB layer 25 is made for example, of $SiO_2$, $SiN_x$ or alternate multiple layers made thereof to form a DBR. In Step S20, a transparent conductive layer 30 (serving as a current spreading layer) is formed covering the light emitting stacked layers 15 and the CB layer 25, as shown in FIG. 2(*c*). The transparent conductive layer 30 preferable includes an oxide containing at least one element selected from zinc, indium, or tin, such as ZnO, InO, SnO, ITO (indium tin oxide), IZO (indium zinc oxide), GZO (gallium-doped zinc oxide). In the illustrated embodiment, the transparent conductive layer 30 is an ITO layer. In Step S25, the ITO layer 30 is etched and exposing a reserved region R for a first pad electrode (p-pad electrode) and for a mesa structure 20 (formed by etching a portion of the light emitting stacked layers), as shown in FIG. 2(*d*). The reserved region R includes an exposed portion of the light emitting stacked layers 15 and an exposed portion of the current blocking layer 25. In Step S30, the exposed portion of the light emitting stacked layers 15 and a substantial portion of the CB layer 25 are dry-etched by Inductively Coupled Plasma (ICP) to form the mesa structure 20 (n-mesa) and a first opening 12. In the illustrated embodiment, the first opening 12 is a pad opening for a p-pad electrode 35 described latter, as shown in FIG. 2(*e*). In Step S35 (Option 1 as shown in FIG. 1), the CB layer 25 is not wet-etched but dry-etched under ICP, and leaves behind 1000-2000 angstrom in thickness, and a p-pad electrode 35 is formed by filling the pad opening 12 above the remaining CB layer 25 having 1000-2000 angstrom in thickness, and a second pad electrode (n-pad electrode) 40 is formed on the mesa structure 20, as shown in FIG. 2(*f*). Alternatively, instead of Step S35, Step S40 (Option 2 as shown in FIG. 1) can be performed, in which the CB layer 25 is wet-etched to be completely removed to form a pad opening 12' as shown in FIG. 2(*h*), and in Step S45, a pad (p-pad) electrode 35 is formed by filling the pad opening 12 and a second pad electrode (n-pad electrode) 40 is formed on the mesa structure 20, as shown in FIG. 2(*i*). Then, afterwards, in Step S50: a passivation layer 50 is deposited over a top surface of the light emitting device 1 except for the top surfaces of the p-pad electrode 35 and the n-pad electrode 40 respectively, which are left exposed, as shown in FIGS. 2(*g*) and 2(*j*). Referring to FIG. 3, the current blocking layer (CB) 25 formed in step S15 of FIG. 2(*b*), the mesa structure 20 and the transparent conductive layer 30 (MESA/ITO) formed in step s40 of FIG. 2(*h*), the pad electrodes 35, 40 (Pad) formed in step S45 of FIG. 2(*i*), and the passivation layer 50 (PSV) formed in step S50 of FIG. 2(*j*) are shown from a top view perspective, respectively. In the above fabrication method, the current blocking layer (CB) 25 being made of for example, $SiO_2$ or $SiN_x$, can be used serving as a hard mask upon inductively coupled plasma (ICP) dry etching a portion of the light emitting stacked layers 15 to form the mesa structure 20, while at substantially the same time, a portion of the current blocking layer (CB) 25 is removed by ICP dry etching, and upon completion of the mesa structure 20, wet etching, such as buffered oxide etching (BOE) can be used to remove the remaining CB layer 25, and a P-pad electrode 35 can be filled into the pad opening 12' for contacting a p-GaN layer of the light emitting stacked layers 15, and the pad opening 12' is formed through the CB/ITO layers 25, 30 beneath the p-pad electrode 35 as shown in FIG. 3. The mesa structure 20 includes two portions. in which one portion of the mesa structure 20 is a periphery portion 20a (as shown in FIG. 3) surrounding the light emitting stacked layers 15 and the ITO layer 30, and an another portion of the mesa structure 20 includes a second opening 55 as shown in FIG. 3 and FIG. 4A. In the illustrated embodiment, the second opening 55 is a n-pad electrode opening for the n-pad electrode. The n-pad electrode opening 55 is in and surrounded by the light emitting stacked layers 15 and the ITO layer 30, and a portion of a n-GaN layer (not labeled) of the light emitting stacked layers 15 is exposed in the n-pad electrode opening 55. A n-pad electrode 40 can be filled into the n-pad electrode opening 55 for contacting the n-GaN layer of the light emitting stacked layers 15. The p, n-pad electrodes 35, 40 can respectively include a pad and/or an extending electrode connecting to and extending from the pad. The pad is disposed for an outer power connecting and the extending electrode is used for current spreading when current is injected from the outer power through the pad, current can be spread through the extending electrode. A ratio of thickness of the CB layer 25 to depth of the mesa structure 20 (as measured with respect to the first surface 42 of the light emitting stacked layers 15 is between 1.3-3.3, so as to ensure prevention of over-etching or excessive residue CB layer 25 being formed. Due to adoption of the self-alignment technique in which the patterned ITO layer 30, the patterned CB layer 25, and the mesa structure 20 are formed using the same photoresist mask as described in above Steps S25 and S30, the sidewall of the transparent conductive layer (ITO layer) 30 and the sidewall of the mesa structure 20 are substantially coplanar or flush. In the above light emitting device 1 fabrication method, the passivation layer 50 can be made of insulating material, such as silicon nitride, silicon oxide, silicon oxynitride, or aluminum oxide which is deposited on the defined surface area of the light emitting device 1 using CVD (Chemical Vapor Deposition) technology, PECVD (Plasma Enhanced Chemical Vapor Deposition) technology, electron cyclotron resonance chemical vapor deposition (ECR-CVD) technology, or LPCVD (Low Pressure Chemical Vapor Deposition) technology, whereby the passivation layer 50 is accurately formed without covering the areas of the pad electrodes 35, 40.

Figure 2A:
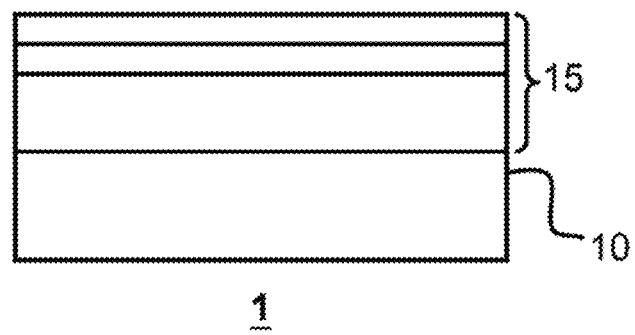
FIG. 2(a) shows cross-sectional views of a plurality of light emitting stacked layers formed above a substrate for the method of fabricating the light emitting device according to the embodiment of present application.
Figure 2B:
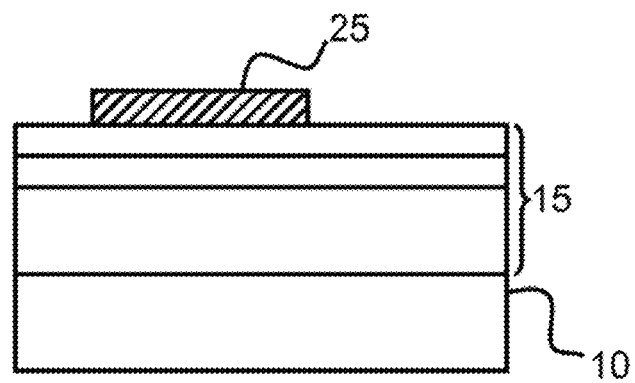
FIG. 2(b) shows a cross-sectional view of a current blocking layer patterned on the light emitting stacked layers for the method of fabricating the light emitting device according to the embodiment.
Figure 2C:
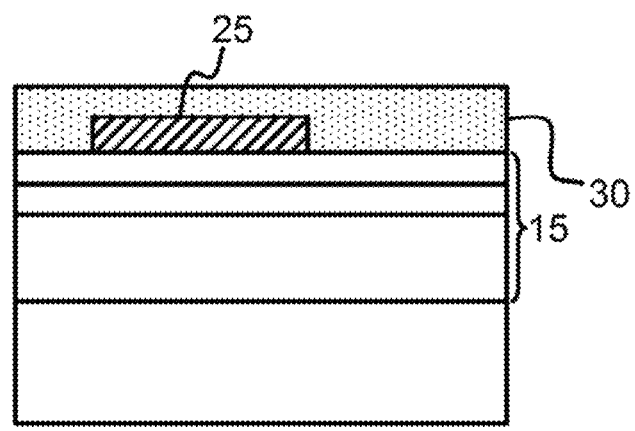
FIG. 2(c) shows a cross-sectional view of a transparent conductive layer formed on the light emitting stacked layers and the current blocking layer for the method of fabricating the light emitting device according to the embodiment.
Figure 2D:
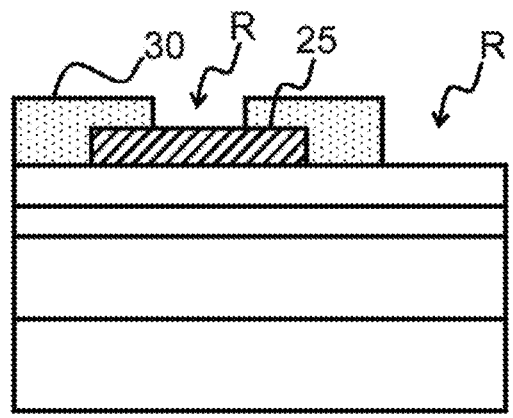
FIG. 2(d) shows a cross-sectional view of the transparent conductive layer etched to expose a reserved region R for the method of fabricating the light emitting device according to the embodiment.
Figure 2E:
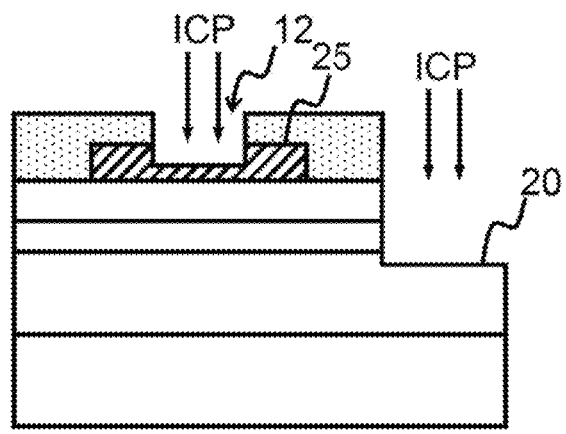
FIG. 2(e) shows a cross-sectional view of a first opening and a mesa structure being formed by dry-etching for the method of fabricating the light emitting device according to the embodiment.
Figure 2F:
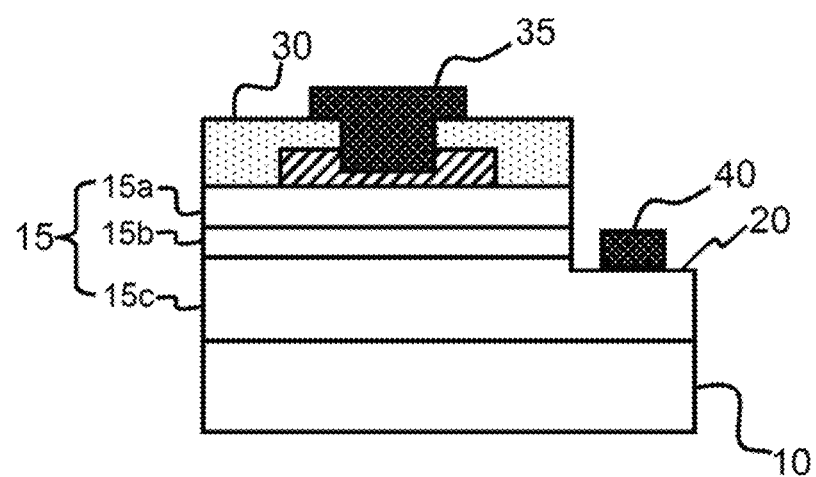
FIG. 2(*f*) shows a cross-sectional view of a p-pad electrode and a n-pad electrode formed in the pad opening and on the mesa structure respectively for an option 1 for the method of fabricating the light emitting device according to the embodiment.
Figure 2G:
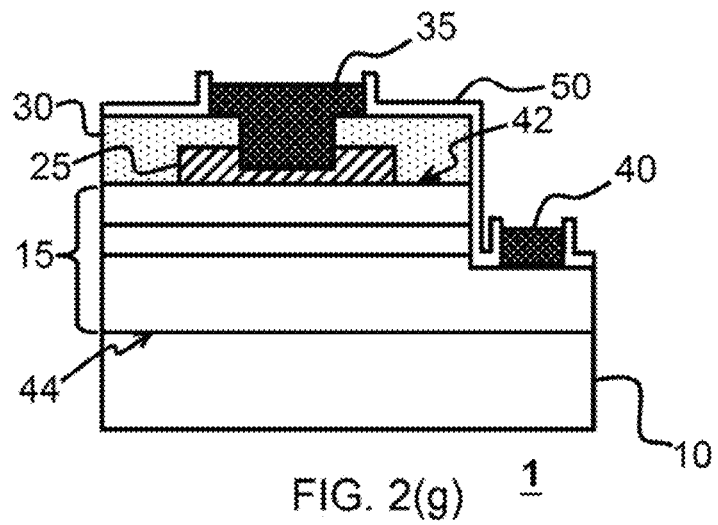
Figure 2H:
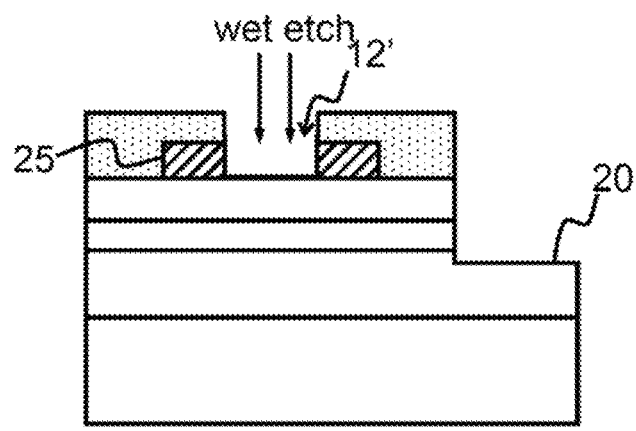
Figure 2I:
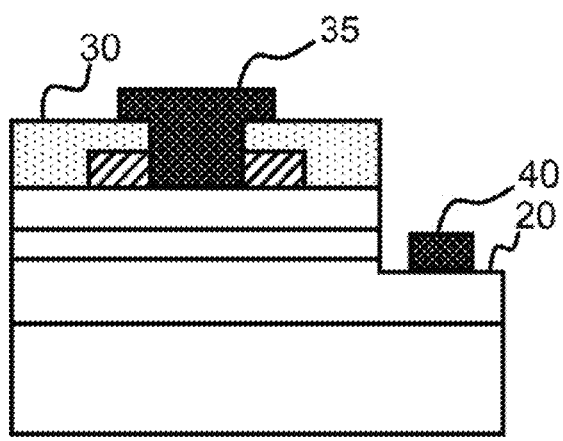
Figure 2J:
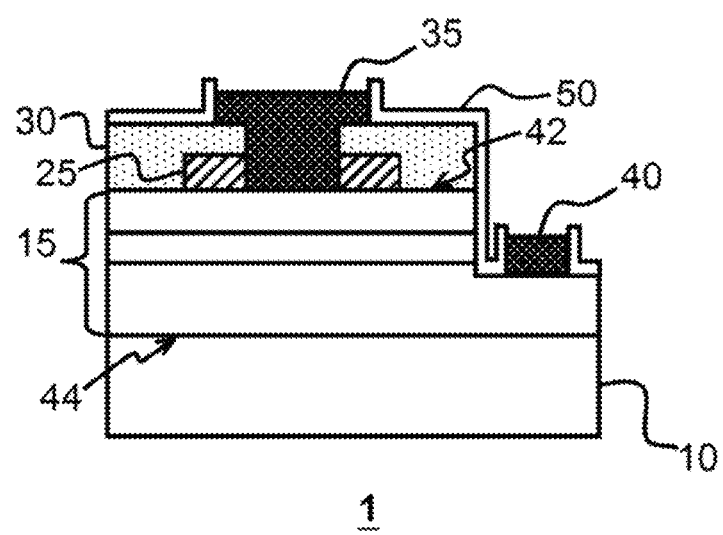
Figure 5A:
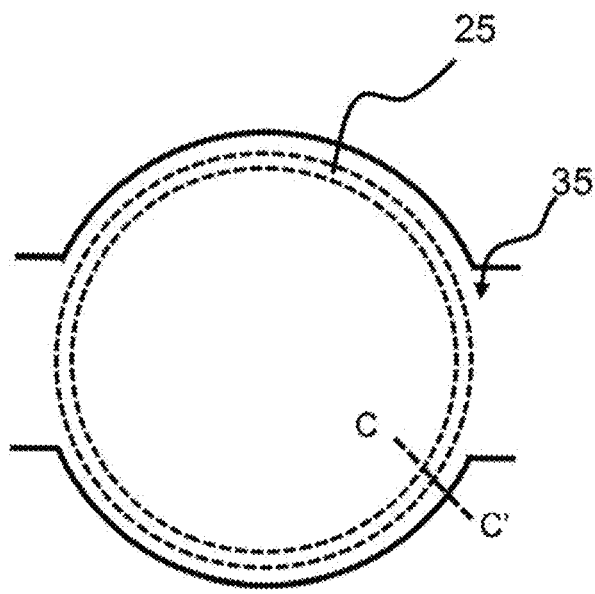
FIG. 5A shows a top view of the p-pad electrode.
Figure 5B:
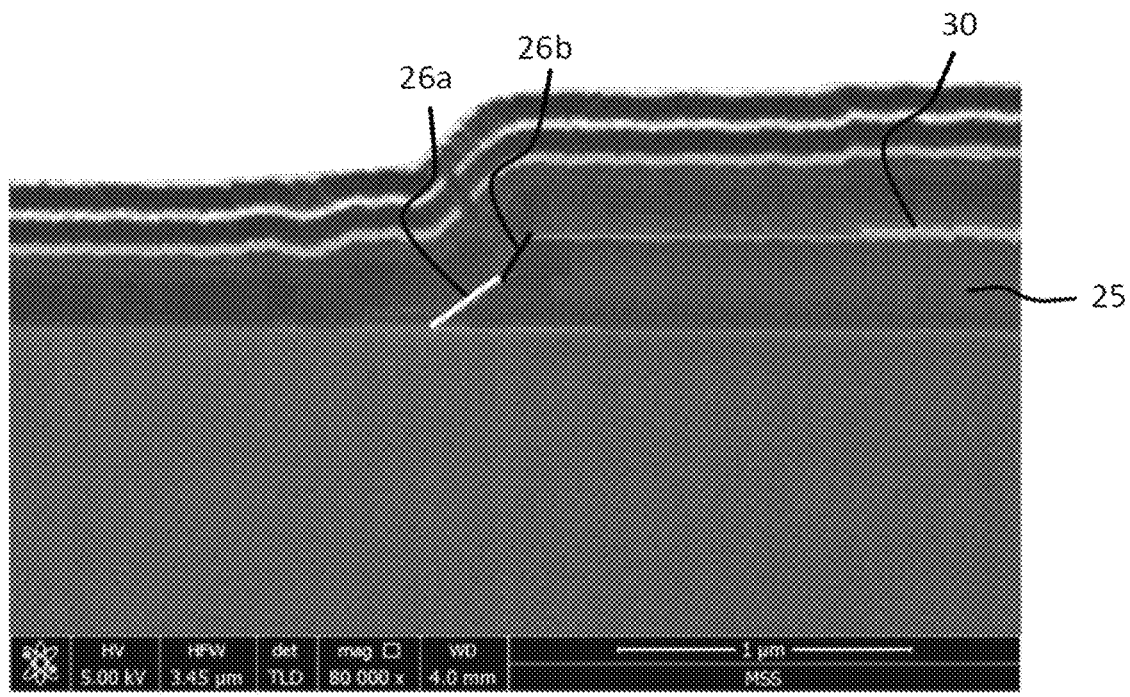
FIG. 5B shows a magnified cross-sectional view SEM diagram of a sidewall of the CB layer having two surface sections of different slopes, which is taken along a dashed line C-C' shown in FIG. 5A.

Referring to FIGS. 2(g) and 2(j), an light emitting device 1 as fabricated according to the embodiment of present application is shown in a cross-sectional view, which includes a substrate 10, a plurality of light emitting stacked layers 15, a mesa structure 20, a CB layer 25, a transparent conductive layer 30 in the form of an ITO layer 30, a p-pad electrode 35, a n-pad electrode 40, and a passivation layer 50. The light emitting stacked layers 15 comprising a first surface 42 and a second surface 44, in which the second surface 44 is closer to the substrate 10 and is electrically opposite to the first surface 42. The transparent conductive layer 30 is disposed and formed on or above the first surface 42 of the light emitting stacked layers 15. The p-pad electrode 35 is disposed on the transparent conductive layer 30 and on the first surface 42 of the light emitting stacked layers 15, and the n-pad electrode 40 is disposed on the second surface 44 of the light emitting stacked layers 15 and on the mesa structure 20. Referring to FIG. 2(g), there is a thinner portion/section of the CB layer 25 between the p-pad electrode 35 and the first surface 42, and the p-pad electrode 35 is in contact with the thinner portion/section of the CB layer 25. Referring to FIG. 2(i), the p-pad electrode 35 is in contact with the first surface 42. The CB layer 25 is disposed on the first surface 42 of the light emitting stacked layers 15, surrounded by the transparent conductive layer 30, and at a lower region of the p-pad electrode 35. In addition, the mesa structure 20 has a n-pad electrode opening 55 in which a portion of the n-pad electrode 40 is filling the n-pad electrode opening 55 of the mesa structure 20. FIG. 4A, shows a top view of the mesa structure 20, the CB layer 25, and the transparent conductive layer 30. The CB layer 25 has a ring-shape as shown in a top view of the light emitting device 1. FIG. 4B shows a partial enlargement view of a (circular dashed-line) portion A of the light-emitting device 1 of FIG. 4A. The mesa structure 20 including the n-pad electrode opening 55 has an edge, the transparent conductive layer 30 of the illustrated embodiment is retracted by a shorter distance B with respect to the edge of the mesa structure 20 from top view. For the sake of preventing residue ITO from causing leakage current issues for the light emitting device 1 and due to having a self-alignment process in which the transparent conductive layer 30 and the mesa structure 20 are formed using the same photoresist mask, the transparent conductive layer 30 of the illustrated embodiment is retracted by the shorter distance B with respect to the edge of the mesa structure 20, of 1 to 2 μm, or less than 3 μm, which is less than that of the conventional fabrication method having ITO-to-mesa retract distance/gap of 5 μm-7 μm. Referring to FIG. 5A, an enlargement top view of the p-pad electrode 35 is shown, and the CB layer 25 under the p-pad electrode 35 is shown by a dashed-line ring structure. In FIG. 5A, a cutting-plane location is identified along a dashed line C-C' in the illustrated embodiment, and a magnified cross-sectional view SEM diagram of a sidewall of the CB layer 25 having two surface sections of different slopes is shown in FIG. 5B. Referring to FIG. 5B, as shown in a cross-sectional view, a sidewall of the CB layer 25 includes two surface sections 26a, 26b having different slopes, in which the surface section 26a has a slope of 10 degrees to 50 degrees and the surface section 26b has a slope of 50 degrees to 70 degrees. In one embodiment, a slope of the surface section 26a is between 10 degrees to 15 degrees. In the illustrated embodiment, the surface section 26a has a slope of 41.6 degrees, and the surface section 26b has a slope of 65 degrees. A sidewall 31 of the transparent conductive layer 30 and a sidewall 16 of the light emitting stacked layers 15 are substantially flush and planar located adjacent to one end of the second surface 44 of the light emitting stacked layers 15 and the mesa structure 20, and adjacent to one end of the first surface 42 of the light emitting stacked layers 15. For the sake of preventing residue ITO from causing leakage current issues for the light emitting device 1 and due to having a self-alignment process in which the transparent conductive layer 30 and the mesa structure 20 are formed using the same photoresist mask, the transparent conductive layer 30 of the illustrated embodiment is retracted a shorter distance with respect to the edge of the surface section 26b of the CB layer 25, of 1 to 2 μm, or less than 3 μm, which is less than that of the conventional fabrication method having ITO-to-CB retract distance/gap of 5 μm-7 μm. In the embodiment, the transparent conductive layer 30 is retracted by a distance with respect to the edge of the surface section 26b of the CB layer 25, of 1.116

μm. In one embodiment, the surface section 26b caused by ICP is also wet-etched during the following remaining CB layer wet etching process. The slope of the surface section 26a is equal to that of the surface section 26b. The slope of the surface section 26a is between 10 degrees to 15 degrees. The ITO-to CB retract distance is between 2 μm to 3 μm.

It is believed that the present embodiments and their advantages will be understood from the foregoing description, and it will be apparent that various changes may be made thereto without departing from the spirit and scope of the embodiments or sacrificing all of its material advantages.

What is claimed is:

1. A light emitting device, comprising:
   a plurality of light emitting stacked layers, comprising a first surface and a second surface, wherein the second surface is electrically opposite to the first surface;
   a mesa structure;
   a current blocking layer disposed on the first surface, comprising a sidewall; and
   a transparent conductive layer disposed on the first surface; and
   a first pad electrode, disposed on the transparent conductive layer and on the first surface;
   wherein a retract distance of the transparent conductive layer with respect to an edge of the mesa structure is less than 3 μm; and
   wherein a retract distance of the transparent conductive layer with respect to an edge of the sidewall of the current blocking layer is less than 3 μm.

2. The light emitting device as claimed in claim 1, wherein the light emitting stacked layers comprise p-type layers, n-type layers, and an active layer sandwiched between one of the p-type layers and one of the n-type layers, and the mesa structure comprises an exposed surface of one of the n-type layers.

3. The light emitting device as claimed in claim 2, further comprising a second pad electrode disposed on the exposed surface.

4. The light emitting device as claimed in claim 1, wherein the light emitting stacked layers comprise p-type layers, n-type layers, and an active layer sandwiched between one of the p-type layers and one of the n-type layers.

5. The light emitting device as claimed in claim 4, wherein the first pad electrode electrically connects the p-type layers; and wherein the light emitting device further comprises a second pad electrode electrically connects the n-type layers.

6. The light emitting device as claimed in claim 1, wherein a sidewall of the transparent conductive layer and a sidewall of the light emitting stacked layers are substantially flush located adjacent to one end of the second surface of the light emitting stacked layers and the mesa structure, and adjacent to one end of the first surface of the light emitting stacked layers.

7. The light emitting device as claimed in claim 1, wherein a retract distance of the transparent conductive layer with respect to an edge of the mesa structure is between 1 μm and 2 μm.

8. The light emitting device as claimed in claim 1, wherein a sidewall of the current blocking layer comprises a first surface section and a second surface section having different slopes.

9. The light emitting device as claimed in claim 8, wherein the first surface section is closer to the first surface of the light emitting stacked layers than the second surface section is; and wherein the first surface section has a slope smaller than that of the second surface section.

10. The light emitting device as claimed in claim 8, wherein the first surface section is closer to the first surface of the light emitting stacked layers than the second surface section is; and wherein the first surface section has a slope of between 10 degrees and 50 degrees and the second surface section has a slope of between 50 degrees and 70 degrees.

11. The light emitting device as claimed in claim 1, wherein the current blocking layer comprises an opening and the first pad electrode electrically connecting the light emitting stacked layers through the opening.

12. The light emitting device as claimed in claim 1, further comprising a passivation layer disposed on the first surface and exposing parts of the first pad electrode.

* * * * *